United States Patent [19]
Tracewell

[11] Patent Number: 5,416,427
[45] Date of Patent: May 16, 1995

[54] TEST AND DEVELOPMENT APPARATUS FOR BUS-BASED CIRCUIT MODULES WITH OPEN SIDE AND BACKPLANE ACCESS FEATURES

[75] Inventor: Larry L. Tracewell, Dublin, Ohio

[73] Assignee: Tracewell Enclosures, Inc., Columbus, Ohio

[21] Appl. No.: 16,725

[22] Filed: Feb. 11, 1993

[51] Int. Cl.$^6$ ............................................. G01R 31/22
[52] U.S. Cl. .................................................. 324/754
[58] Field of Search ................ 324/158 F, 158 P, 725, 324/750, 754; 361/384, 391, 385; 161/80.3, 80.4; 439/482

[56] References Cited

U.S. PATENT DOCUMENTS

| | | | |
|---|---|---|---|
| 3,656,058 | 4/1972 | Leathers | 324/158 F |
| 3,956,673 | 5/1976 | Seid | 165/76 |
| 4,145,620 | 3/1979 | Dice | 361/415 |
| 4,277,816 | 7/1981 | Dunn et al. | 361/384 |
| 4,291,364 | 9/1981 | Andros et al. | 361/384 |
| 4,672,509 | 6/1987 | Speraw | 361/391 |
| 5,003,156 | 3/1991 | Kilpatrick et al. | 324/158 F |
| 5,006,959 | 4/1991 | Freige et al. | 165/80.3 |
| 5,126,656 | 6/1992 | Jones | 324/158 F |
| 5,168,171 | 12/1992 | Tracewell | 307/64 |
| 5,278,495 | 1/1994 | Beaton et al. | 324/158 F |

OTHER PUBLICATIONS

1988/1989 Catalog of Electronic Solutions Unit of Zero Corporation, pp. 19–20.
Catalog of MAC Panel Company 2 pages entitled "VXI 1200 Series Model 1226D, Six Slot Portable Mainframe" Catalog date: Jan. 1, 1989.
"EDN" vol. 37, No. 22A, Dec. 3, 1992, p. 36, advertisement entitled New Debug Station Verifies Future Bugst Plug-in Boards, by Schroff, Inc.

Primary Examiner—Vinh Nguyen
Attorney, Agent, or Firm—Mueller and Smith

[57] ABSTRACT

Bus-based computer system circuit modules are developed and tested in a desk-top apparatus including a base supported for select tilting upon a cradle. The base, in turn, supports a backplane support assembly which, in turn, supports a top assembly to define a card cage having open sides. A backplane into which the circuit modules may be plugged is supported by the backplane assembly, and access to the active components of the circuit modules is provided through the open sides. The rearward face of the backplane is made accessible for wire wrapping procedures and the like by mounting the power supply for the apparatus below the backplane and providing for the tilting of the assemblage downwardly and forwardly to improve rearward face access. Both voltage and current are monitored at the backplane and the values of these parameters are displayed at digital meters mounted upon the top assembly. The latter, current monitoring is carried out using closed loop Hall effect sensors. Fans are incorporated in conjunction with the card cage which have variable speeds and a temperature sensor is provided to measure the temperature of air passing over the cards under evaluation. The measured temperature is displayed at the front of the assembly. A nulling network is provided to optionally null static current generated as a consequence of terminating resistor components within the backplane.

29 Claims, 10 Drawing Sheets

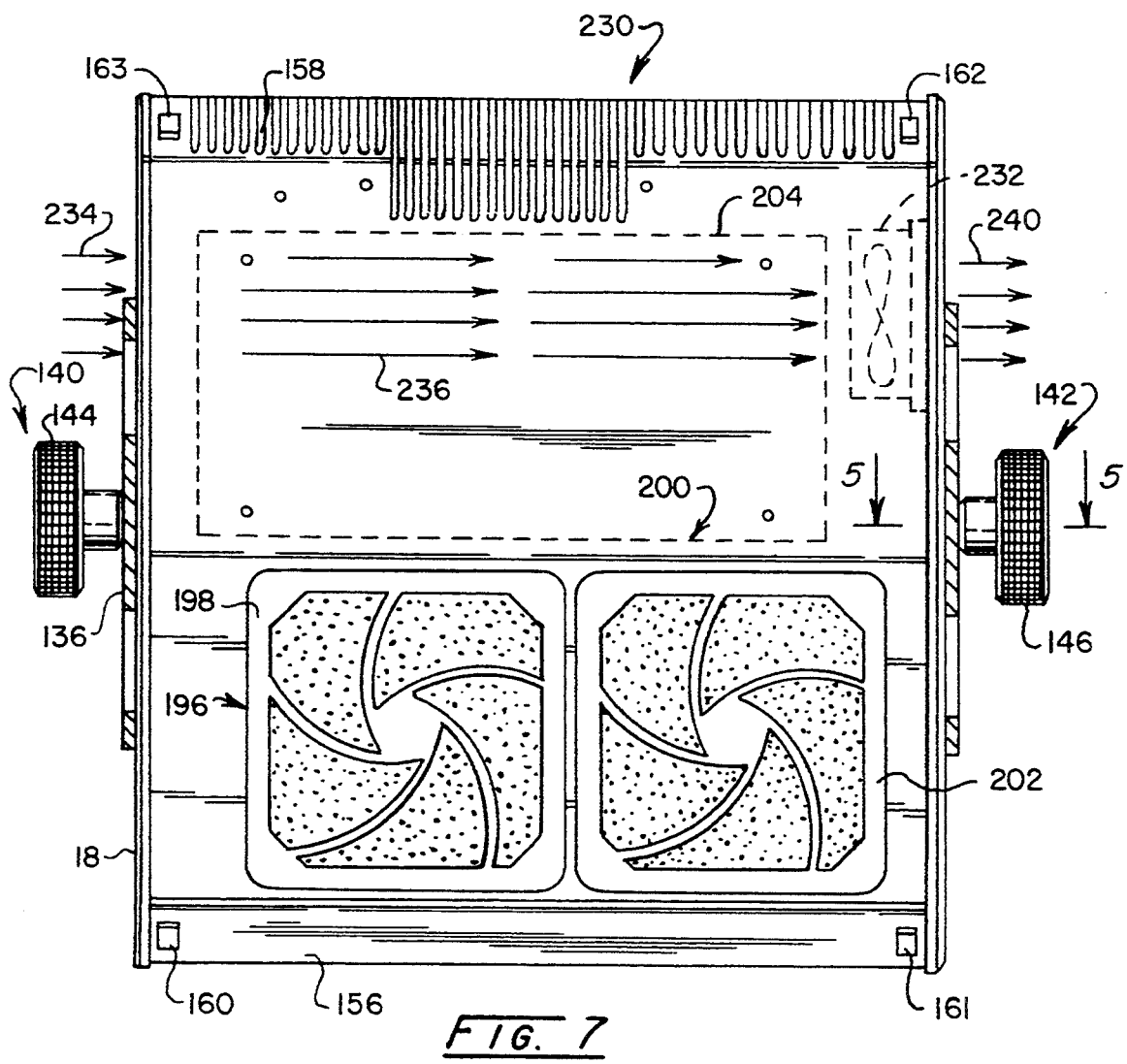
FIG. 7
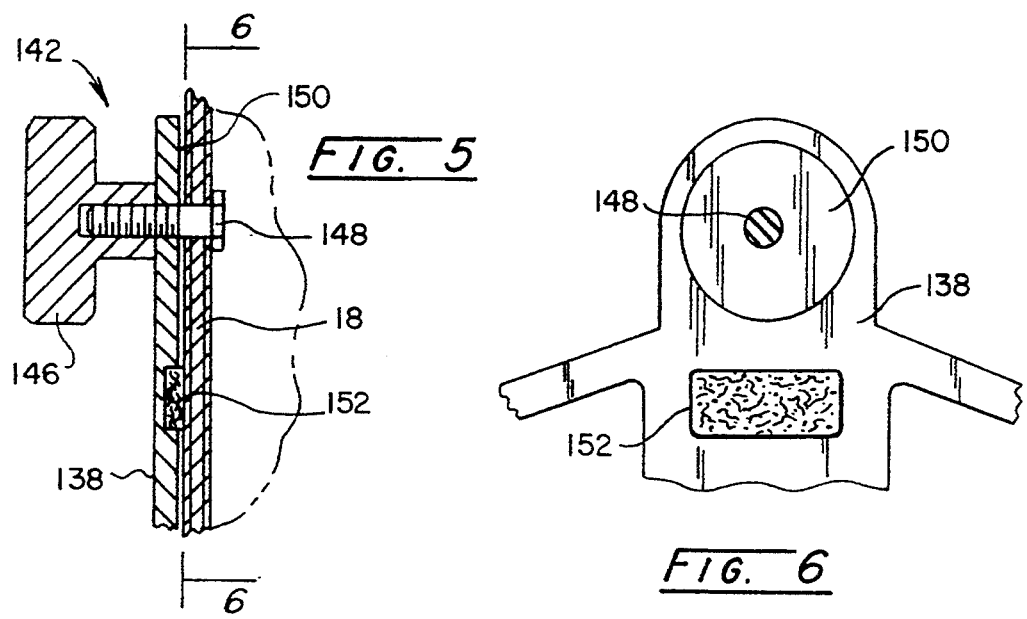
FIG. 5
FIG. 6

TEST AND DEVELOPMENT APPARATUS FOR BUS-BASED CIRCUIT MODULES WITH OPEN SIDE AND BACKPLANE ACCESS FEATURES

BACKGROUND OF THE INVENTION

Electronic systems of higher sophistication conventionally are developed as one or a sequence of printed circuit boards which are retained within rack-mounted or stand-alone enclosures. These enclosures or housings typically include circuit supporting features such as backplane buses dedicated power supplies, cooling fans, and air filtering.

The electronics industry has recognized the advantages of establishing compatibility standards for the size, interconnect architecture, and mounting and insertion techniques associating these circuit boards, which are often referred to as "cards" or "modules", with backplane bus structures. To implement this call for standardization, industry organizations have evolved forms of consensus which has been manifested in the generation of guiding publications and the like. As an example, a back-plane bus having the trade designation "VERSABUS" was introduced by Motorola, Inc. to support the 16 bit microprocessor. European manufacturers proposed to modify this bus so that it could be used for systems constructed on standard Eurocard printed-circuit boards. Signetics/Philips, MOSTEK Corp., and Motorola, Inc. produced a draft standard for such a modified bus in 1981 which was named "VME Bus" (Versa Module Eurocard). For further discussion see, for example, "Micromputer Bus Structures and Bus Interface Design" by Dexter, Marcel Dekker, Inc., 1986, New York, N.Y. The VME architecture currently is widely utilized but is limited to 16 bit logic. As a consequence of this limitation, other standardizations have evolved or are under consideration, including a 32-bit logic future bus+and a 64-bit backplane.

Tracewell, U.S. Pat. No. 05,168,171 issued Dec. 1, 1992, describes an improved enclosure for circuit modules which is microprocessor driven to monitor the status of such voltage sources and provide outputs at a supervisory panel mounted at the front face of the enclosure. The enclosure further includes a computer monitored heat transfer air path of highly improved design. These monitoring features are powered from a separate power supply which, in turn, is buttressed by rechargeable battery back-up performing in conjunction with a d.c.-to-d.c. converter. With this form of enclosure, the somewhat costly circuit modules, for example ranging in value to about $10,000.00, are afforded substantially improved environmental and power input protection over their operational lifespans.

The design of these circuit modules or cards necessarily involves numerous phases or stagings. However, all such engineering endeavors culminate in the determination of requirements for power supply, heat removal capacities, and the like. The more final stages include the testing of modules, alone or in system configurations. This testing typically is carried out by adapting conventional enclosures or frame structures to the task. Where multiple cards are involved, somewhat complex wire wrapping typically is called for at the rear of the backplane. Such hand interconnecting, in turn, requires the identification of an interconnection or pin mount with myriads of backplane mounted pins, for example at the J2 regions of the backplane or the equivalents thereof. Very often, adjacently mounted power supplies severely interfere with this already physically arduous procedure. The probing of test points and the like at active faces of the cards while under test also calls for physical access. This access is provided by extender cards having one edge plugging into the cage backplane while the opposite end plugs into and supports the connecting end or edge of the card under test. As might be expected, the resultant card support is tenuous and somewhat structurally unsound. Where high speed data transfer is involved, the inherent circuit elongation may lead to inaccurate circuit evaluation.

The conventional approach to determining power supply requirements has involved a procedure of summing the published current requirements for each component of a card making up a system. A safety factor then is applied to that sum and the result so reached is specified as the power supply requirement. Often, this procedure results in an over-capacity of power supply with attendent costs, heat generation, and bulk packaging requirements. Alternately, current to the cards under test can be measured at the power supply. However, this involves the disassembly of the power supply distribution network for the purpose of accessing measurement points and the insertion of shunts and the like. Finally, a measurement of current is carried out. However, this practice may become so labor intensive as to be impractical.

The selection of fan requirements often is simply based upon prior experience, a size being selected by the engineer which assures more than adequate air flow. Alternately, where a heat analysis is called for, the fans within an enclosure adapted for testing can be disconnected from the enclosure power supply and driven at varying speeds from a controllable bench power supply. As this variation in fan speed is carried out, air temperatures can be measured using hot wire animometers, or the like, within the testing enclosure. Of course, the latter procedure is labor intensive and, consequently, costly. The use of experience based air flow determinations can be somewhat tenous during lengthy circuit "burn in" procedures where circuit heat generation may vary unexpectedly. Where such anomalies do occur, the opportunity for substantial financial loss increases considerably.

With the completion of testing of the hardware aspect for the circuit modules, very often the next procedure is to deliver the modules to programmers for the purpose of evolving complementary software or firmware. This calls for transporting the adapted enclosure with the modules to the working space of the programmer in addition to the bulksome and very often awkward assemblage of test frame and modules, the programmer often is confronted with open and accessible circuit components, for example at the power supply side of the backplane which may be hazardous to those inexperienced in working with circuits. Thus, the testing assemblages for the circuit modules need to be configured with the full panoply of technical participants in mind.

SUMMARY

The present invention is addressed to apparatus for testing and developing circuit board modules which provide substantially improved access to module carried circuit components, as well as to the rearward open face of a backplane with which the circuit modules are operationally associated. Access to the circuit components of the modules is achieved without resort to extender cards or the like, the surfaces of the modules being exposed while directly attached to a backplane by open-sided structuring. This forward access further is enhanced by the utilization of a pivotal, cradle-based mounting of the apparatus such that the front thereof can be tilted upwardly while the circuit board remains operational and accessible.

Access to the rearward face of the backplane is facilitated by a structuring wherein the apparatus power supply having outputs coupled with the rearward face of the backplane is mounted below it. Such backplane rearward face access further is facilitated by the pivotal mounting of the apparatus permitting its rearward side exposing the backplane to be tilted upwardly. Thus tilted upwardly, an improved ergometric access to the backplane rearward face is achieved., aiding the technologist in wire wrapping procedures and the like.

Circuit module evaluation and design also is improved through the utilization of circuitry which monitors both the voltage and current demands of the modules, not at the power supply, but as they are present at the backplane. The values of these monitored circuit parameters are displayed at outputs mounted on the apparatus. Thus, the technologist may empirically derive accurate power supply requirements, avoiding the costs and volume penalties of power supply overspecification. These same monitor outputs may also greatly facilitate trouble-shooting procedures.

The module or card cage of the apparatus may be enclosed for heat analysis by closing its normally open sides through the use of transparent, slidable mounted side panels in combination with forwardly mounted filler panels. For this heat analysis, circuit board fans are mounted so as to direct a positive pressure air flow from an intake port across the card cage to an output port at selectively variable fan speeds. The temperature of the air adjacent the output port is measured utilizing a temperature sensor which is mounted and maneuverable over select locations of the card cage. Through the utilization of a temperature buffer circuit, a value of temperature is derived and displayed to the technologist. In one embodiment, fan speed may be regulated by the air sensor itself to assure safe burn-in procedures and the like. By providing multi-speed fans controllable by the operator, fan noise may be lowered with safety where the apparatus is used for software programming purposes and the like. To assure appropriate cooling of the power supply, a separate continuously on fan is provided therewith and a portion of the card cage fan generated air is diverted over the power supply.

The test apparatus also provides an accommodation for static currents normally drawn or occasioned by terminating resistors formed within the backplane itself. At the election of the technologist, these backplane currents may be nulled to provide output readings of current which represent the current draw only of the circuit modules under investigation as opposed to a combination of backplane static current and card drawn current.

Another feature of the invention is to provide apparatus supportable upon a given surface for testing circuit board modules having circuit components mounted upon a generally planar surface. The apparatus includes a base having a base forward surface extending between oppositely disposed first and second base sides, an upward portion, and a plurality of parallel, spaced apart lower module support components disposed along the upward portion. A backplane support assembly having oppositely disposed first and second retainer sides is provided, the support assembly extending upwardly from the base upward portion to an upwardly disposed region. A backplane is supported by the backplane support assembly and has a forward face including a plurality of parallel module connectors located in alignment with the lower module support components. The backplane additionally is formed having a rearward face supporting a plurality of connector positions associated with the module connectors. A top assembly is supported from the backplane support assembly upwardly disposed region and is spaced from and extends over the base and has a plurality of parallel, spaced apart upper module support components disposed in alignment with the lower module support components. The top assembly, the backplane support assembly, and the base interconnect to define a U-shaped module support having open sides. A cradle assembly having a foot portion supportable upon the given surface and having a pivot assembly spaced upwardly from the foot portion is pivotally connected with the base and the pivotal portion is actuable to effect a variable angular orientation of the base with respect to the given surface to enhance manual access to the backplane.

Another feature of the invention provides apparatus for testing circuit board modules having openingly accessible circuit components mounted upon a generally planar surface. The apparatus includes a base having a top portion, a forwardly disposed portion extending between oppositely disposed base sides, and a rearwardly disposed portion. A plurality of parallel, spaced apart lower module support components are mounted upon the base forwardly disposed portion of the base top portion. A backplane support assembly extends upwardly to an upwardly disposed region from the base top portion at a location between the base forwardly disposed portion and the rearwardly disposed portion and a backplane is supported by the backplane support assembly. The backplane has a forward face including a plurality of parallel module connectors located adjacent to and in alignment with the lower module support components. The backplane additionally has an openly exposed rearward face supporting a plurality of connector the base forwardly disposed portion, the backplane support assembly, and the backplane forward face defining a module support having at least one open side, positions associated with the module connectors. A power supply is provided which is mounted within the base rearwardly disposed portion below the backplane and below the base top portion and has predetermined voltage categorized output. A conduit arrangement provides for coupling the power supply voltage characterized outputs with the backplane.

Another feature of the invention provides apparatus for testing circuit board modules. The apparatus includes a test housing having a forward portion for receiving and supporting the circuit board modules. The backplane is supported by the housing adjacent the forward portion and has a forward face including a plurality of module connectors for electrical connection with the circuit board modules and further has a rearward face supporting a plurality of connector positions associated with the module connectors. A power supply is mounted within the test housing and has predetermined voltage characterized outputs. A conduit arrangement is provided for electrically coupling the power supply voltage characterized outputs to predetermined power input locations at the backplane. An electrical parameter monitor arrangement responds to a select electrical parameter and is located substantially in immediate adjacency with at the predetermined power input location for deriving an electrical parameter signal corresponding with the select electrical paramenter as it occurs at the backplane. A visual readout is mounted on the test housing and responds to the electrical parameter signal for displaying a numerical value corresponding therewith.

The invention, accordingly, comprises the apparatus possessing the construction, combination of elements, and arrangement of parts which are exemplified in the following detailed disclosure.

For a fuller understanding of the nature and objects of the invention, reference should be had to the following detailed description taken in connection with the accompanying drawings.

BRIEF DESCRIPTION OF THE DRAWINGS

FIG. 5 is a partial sectional view taken through the plane 5—5 shown in FIG. 7;

FIG. 6 is a partial side view taken through the plane 6—6 shown in FIG. 5;

FIG. 7 is a bottom view of the apparatus of FIG. 2 taken through the plane 7—7 shown therein;

DETAILED DESCRIPTION OF THE INVENTION

Figure 1:
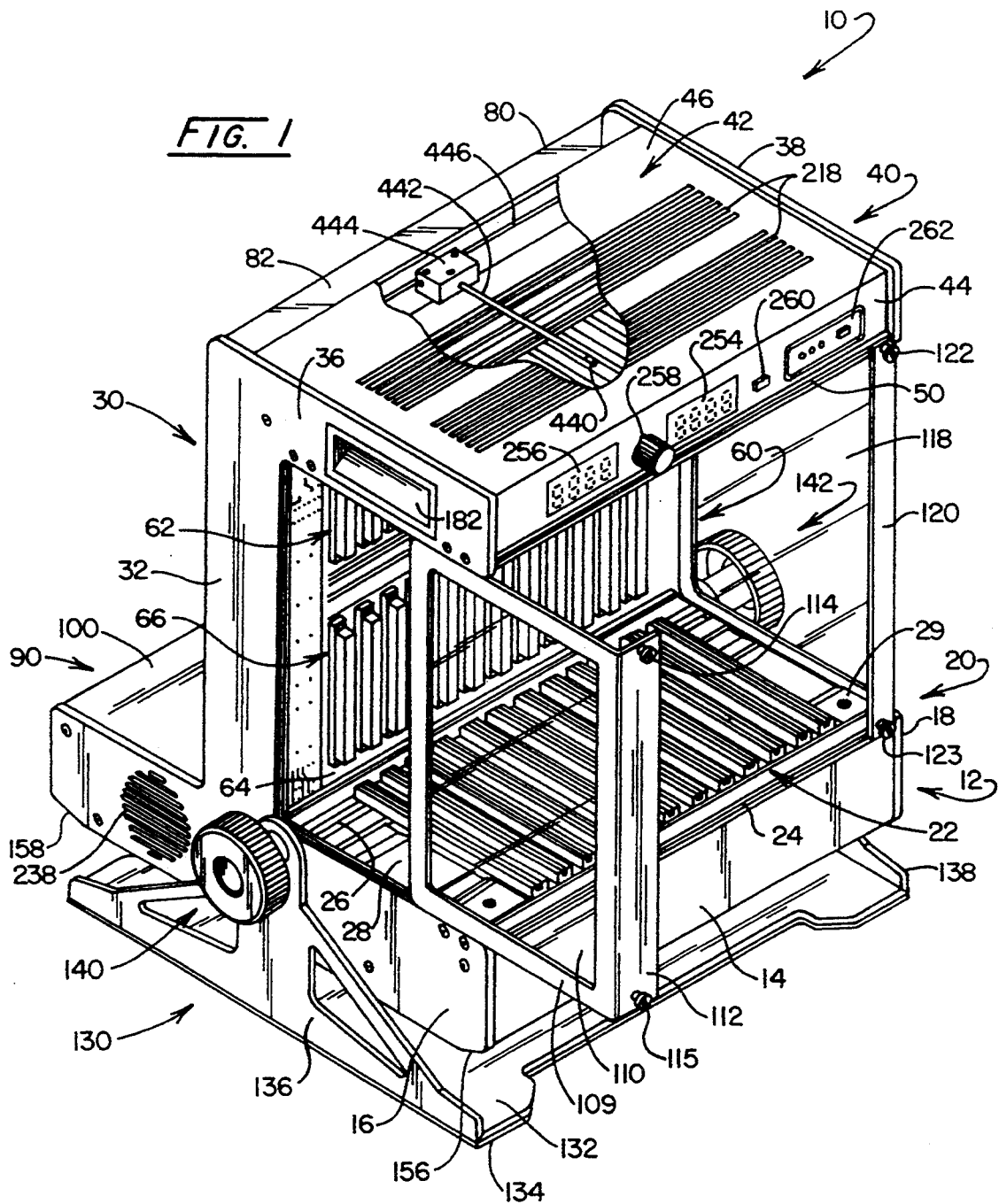
FIG. 1 is a perspective view of the apparatus of the invention with portions broken away to reveal internal structure.

In the description to follow, the circuit module test apparatus of the invention is described in conjunction with a VME specified backplane. It should be understood that the apparatus readily incorporates other backplane systems such as VME 64, Multibus II ®, and the like. Inasmuch as the VME bus system is currently the more actively selected system, the accompanying drescription employs that topology. Referring to FIG. 1, the circuit module test apparatus is revealed in general at 10. Apparatus 10 includes a base represented in general at 12 which has a forward surface 14 extending between oppositely disposed base sides as at 16 and 18. The upward portion of base 12 as represented generally at 20 is seen to support a plurality of parallel, spaced-apart lower module support components represented generally at 22. These lower module support components as at 22 function to support the lower edge of the cards or circuit modules retained within the apparatus 10. Support components 22, in turn, are supported at their undersides by cross supports 24 and 26 which are seen to be connected to the generally upward portions of base sides 16 and 18 by machine screws. Two, base filler panels 28 and 29 are mounted upon cross members 24 and 26 at opposite sides of the arrayed lower module support components 22. Panels 28 and 29 serve to promote air flow through the openings intermediate adjacent ones of those components 22. From the upward portion of base 12 there extends a backplane support assembly represented generally at 30. Assembly 30 includes oppositely disposed sides 32 and 34 (see additionally FIG. 4) formed integrally with respective base sides 16 and 18, and which extend to form the sides 36 and 38 of a top assembly represented generally at 40. Top assembly 40 additionally is configured having a channel-shaped housing represented generally at 42 which, as seen additionally in FIG. 3, includes an integrally formed front panel 44, a top panel 46, and a rearward support panel 48. Sides 36 and 38 are seen to be integrally formed with the corresponding respective sides 32 and 34 of backplane support assembly 30, and are interconnected with housing 42 in similar manner as the forward portion of base sides 16 and 18. In this regard, FIG. 3 reveals the provision of two transverse upper cross supports 50 and 52 which are connected by machine screws to sides 36 and 38. Cross supports 50 and 52, in turn, support a plurality of parallel, spaced-apart upper module support components as are represented generally at 54 in FIGS. 2 and 3. Components 54 are seen to be disposed in alignment with the lower module support components represented generally at 22 such that oppositely disposed pairs of these components may slidably receive circuit modules as represented in phantom at 56 in FIG. 2. Note that the panels so received are vertically oriented.

Figure 2:
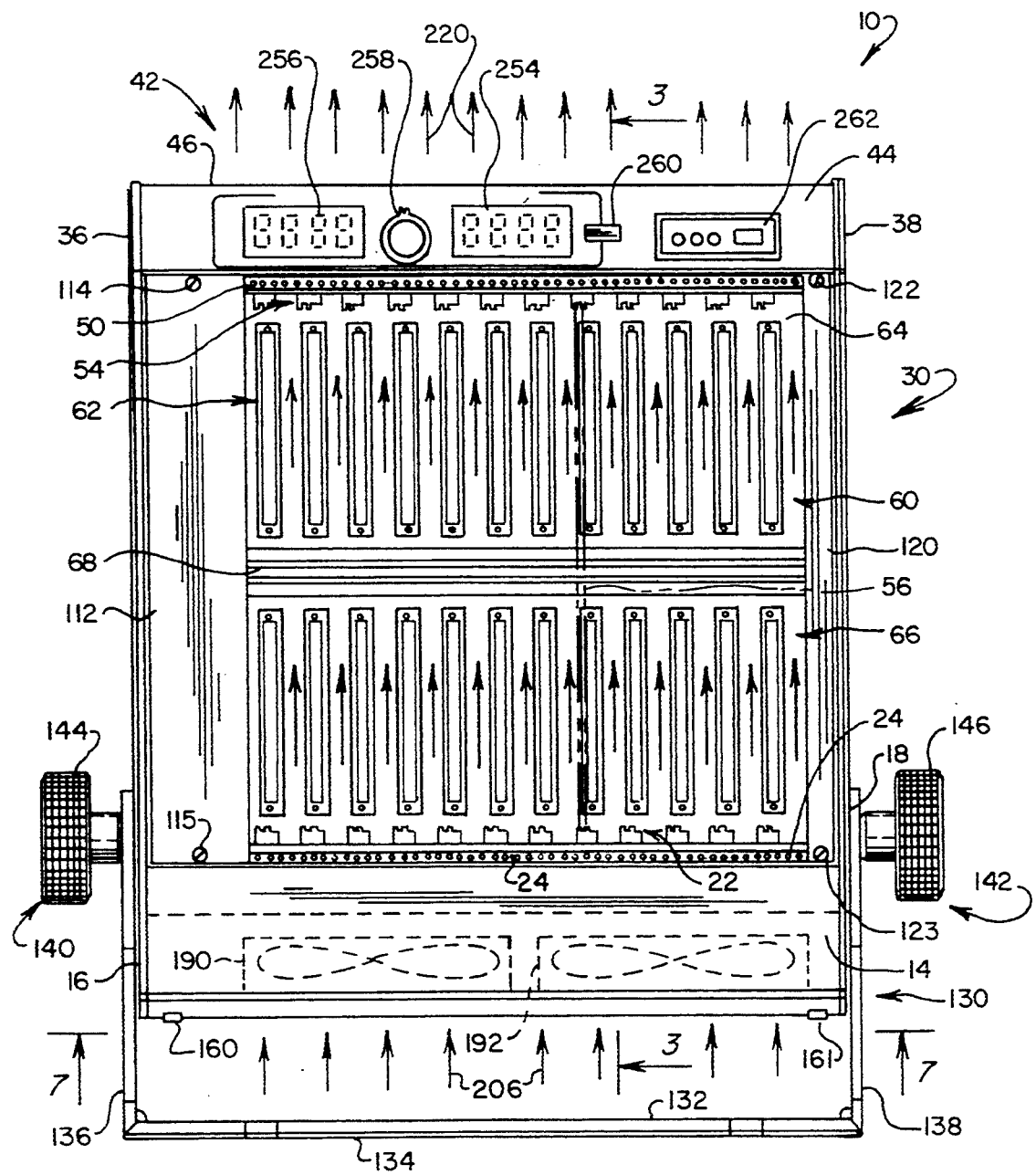
FIG. 2 is a front view of the apparatus of FIG. 1.
Figure 3:
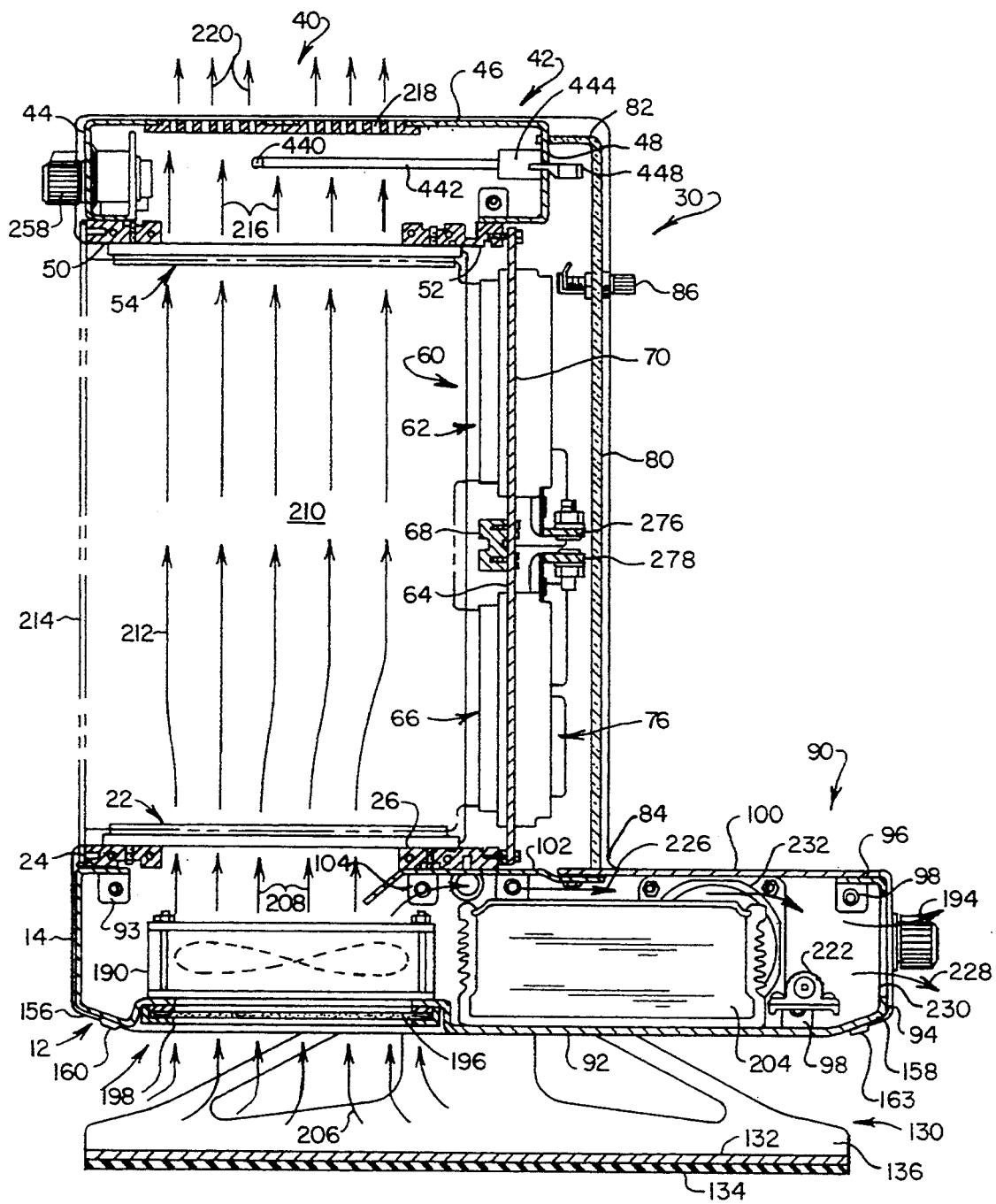
FIG. 3 is a sectional view of the apparatus of FIG. 2 taken through the plane 3—3 shown therein.

An exemplary VME bus backplane is represented generally at 60. The topology of backplane 60 provides for an upper plurality of vertically oriented module connectors generally referred to as "J1" which are considered to be fully defined, and are represented generally at 62 as extending forwardly from the forwardly disposed face 64 of the assembly 60. Beneath and vertically aligned with the J1 designated module connectors are undefined module connectors as represented generally at 66 within what is referred to as a "J2" portion of the backplane 60. It may be observed that these parallel arrayed module connectors 62 and 66 are vertically aligned with the corresponding support components 22 and 54. FIGS. 2 and 3 reveal that the backplane 60 is retained by machine screws against cross supports 26 and 52. Additionally, a middle cross support 68 is coupled to the backplane 60 and, in turn, is attached by machine screws (not shown) to sides 32 and 34.

Figure 4:
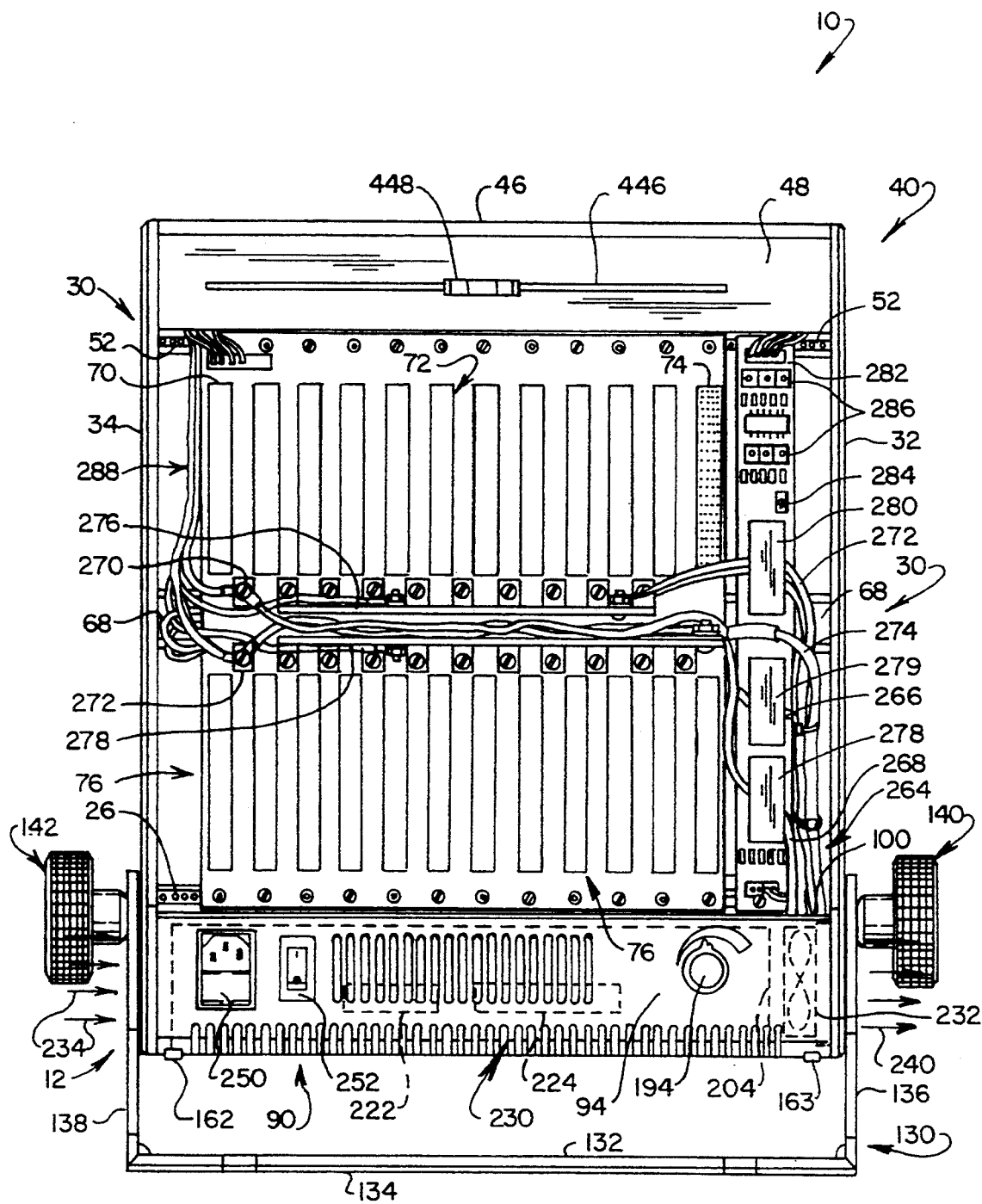
FIG. 4 is a rear view of the apparatus of FIG. 1 with the back panel thereof removed.

Looking to FIGS. 3 and 4, the rearward face of backplane 60 is shown at 70. At this rearward face 70, the VME bus provides a sequence of seldomly accessed terminals corresponding with pin components within the J1 forward section 60. The array of such terminals is represented in general at 72. One multi-pin output is provided at one end of the bus 60 as at 74 which is typically referred to as "J101". Beneath the array 72 and corresponding with the connectors 66 in the J2 array, there are a plurality of multi-pin connectors represented at 76 which correspond with the pin connector outputs at array 66. In general, the technician utilizing the VME bus will carry out "wire wrap" operations with a myriad of small leads interconnecting various pins within the connectors of array 76. This somewhat complex assemblage at the rearward face 70 of the backplane 60 is covered by a polycarbonate transparent cover or rear panel shown at 80 in FIG. 3. Panel 80 is formed having a forward extending portion 82 which is fastened into slots within back support 48 of the top assembly 40 and further includes similar slots (not shown) at its lower edge 84. The panel 80 is retained in position additionally by two spaced latching fasteners, one of which is shown in FIG. 3 at 86. Panel 80, while removable for wire wrapping procedures, testing, and the like, serves additionally to protect the user of the apparatus 10 from electrical shock. Its value, in particular, occurs when the apparatus 10 has been transferred by electronics technologists to programming specialists having no professional concern with the power supplies and electrical connections at this rearward region.

Looking to FIGS. 1, 3, and 4, the base 12 is seen to extend rearwardly from the backplane 60 and associate support 30 to a rearward region represented generally at 90. To form this rearward portion 90, each of the sideplates 16 and 18 extend integrally rearwardly and are coupled to the internal base structure which represents a continuation of the forward surface 14 such that the base includes a bottom surface 92 (FIG. 3) which is formed by bending to define a rear face 94 (FIGS. 3 and 4) terminating in a flat tab portion 96 employing tabs represented at 98 in FIG. 3. The unitary structure including surfaces 14, 92, 94, and 96 is attached to the oppositely disposed base sides 16 and 18. To complete the rearward portion 90, a cover plate 100 is attached to the base portion 96 and to a transversely disposed air deflector component in FIG. 3 at 102. Component 102 is attached to the base sides 16 and 18 by downwardly depending tabs, two of which are shown at 104.

As represented in FIG. 1, with the configuration of base 16, backplane support assembly 30 and top assembly 40, a U-shaped module support having open sides is defined. This otherwise open card supporting region may be enclosed for the purpose of carrying out air flow and heat analysis initially through the utilization of slidably insertable or slide-in transparent side panels, the transparent components of which are formed, for example, of a tinted polycarbonate. FIG. 1 reveals a left-side panel 110 being slidably received within slots formed within the appropriate upward edge of the forward portion of base 16 and the downwardly disposed edge of the upper side portion 36. Preferably, the slots are developed through the fabrication of all side members in laminar fashion. A similar slot is presented to the panel 110 along the forward facing edges of upstanding sides 32 and 34. The aluminum frame portion 109 of left-side panel 110 is seen to have an integrally configured forward cavity securing panel 112 with spaced-apart hand-turnable screws 114 and 115 which are configured to engage corresponding threaded cavities formed within respective cross members 50 and 24 as described in conjunction with FIG. 2. A linear array of such threaded cavities is seen in the latter figure. Panel 112 which is provided and is dimensioned across the front face of apparatus 10 such that its inwardly extending edge will abut against the corresponding small DIN panel of a circuit module or card positioned in the first adjacent ones of the associated module support components. In similar fashion, a right-side panel is provided for slidable insertion within corresponding grooves within sides 18, 38, and the forwardly disposed edge of side 34. Panel 118 includes a framed translucent polycarbonate window portion in the same manner as panel 112 along with a forward cavity securing panel 120 incorporating hand.-actuable screws 122 and 123. As before, screws 122 and 123 arc located to engage corresponding threaded cavities within respective cross supports 50 and 24. FIGS. 1 and 2 show the widthwise extent of panel 120 to be less than that of panel 112 inasmuch as the first combination of module support components is closer to the right side of the apparatus 10 as viewed from the front thereof. The entire cavity 210 representing the U-shaped enclosure may be enclosed with a combination of the DIN panels associated with each module as well as supplementing or "filler" panels (not shown) which arc attached to the cross supports 24 and 50 by similar screw techniques. The transparent components of panels 110 and 118 permit the user of apparatus 10 to observe the circuits under air flow and heating test, and, in particular, to retain a capability for observing small light emitting diodes (LEDs) which may be mounted upon the cards so enclosed. As is apparent, the widthwise extent of panel components as at 112 and 120 will vary depending upon the particular topology of backplane employed with the apparatus 10.

The assemblage of the base 16, backplane support assembly 30, and top assembly 40 is seen to be mounted upon a cradle assembly represented generally at 130. As seen in FIGS. 1, 2, and 4, cradle assembly 130 includes a foot portion 132 of generally flat configuration and upon the underside of which there is adhesively attached a thin sheet of polyurethane foam 134 permitting the foot 132 to rest upon a given table surface or the like in a secure, non-sliding manner. Welded to the foot portion 132 are two triangularly shaped uprights 136 and 138. Uprights 136 and 138, in turn, support respective pivotal mounting assemblies 140 and 142. Assemblies 140 and 142 are seen to include relatively large and easily grasped internally threaded knobs 144 and 146. Knobs 144 and 146 are used by the operator to adjust the orientation of the base 16 of apparatus 10 by loosening and tightening them. Referring momentarily to FIG. 5, pivotal mounting assembly 142 is represented in closer detail in an orientation wherein knob 146 has been used to tighten and lock the assembly. Note that a bolt 148 extends through an appropriate bore in laminar base side 18 and thence through upright 136 for threadable engagement internally with knob 144. A fiber spacer or washer 150 is seen positioned intermediate the outwardly disposed surface of side member 16 and upright 138 as seen additionally in FIG. 6. FIGS. 5 and 6 also reveal the presence of a felt braking pad 152 functioning to ensure the integrity of any orientation of the apparatus 10 provided by the foregoing tilt adjustment.

Looking to FIGS. 1 and 3, it may be observed that the lower forward and rearward ends of the base 12 at the lower surface thereof as depicted., respectively, at 156 and 158, are tapered or angled upwardly and, as seen in FIG. 7, support polymeric bumper pads as seen in FIG. 7 at 160–163.

Figure 8:
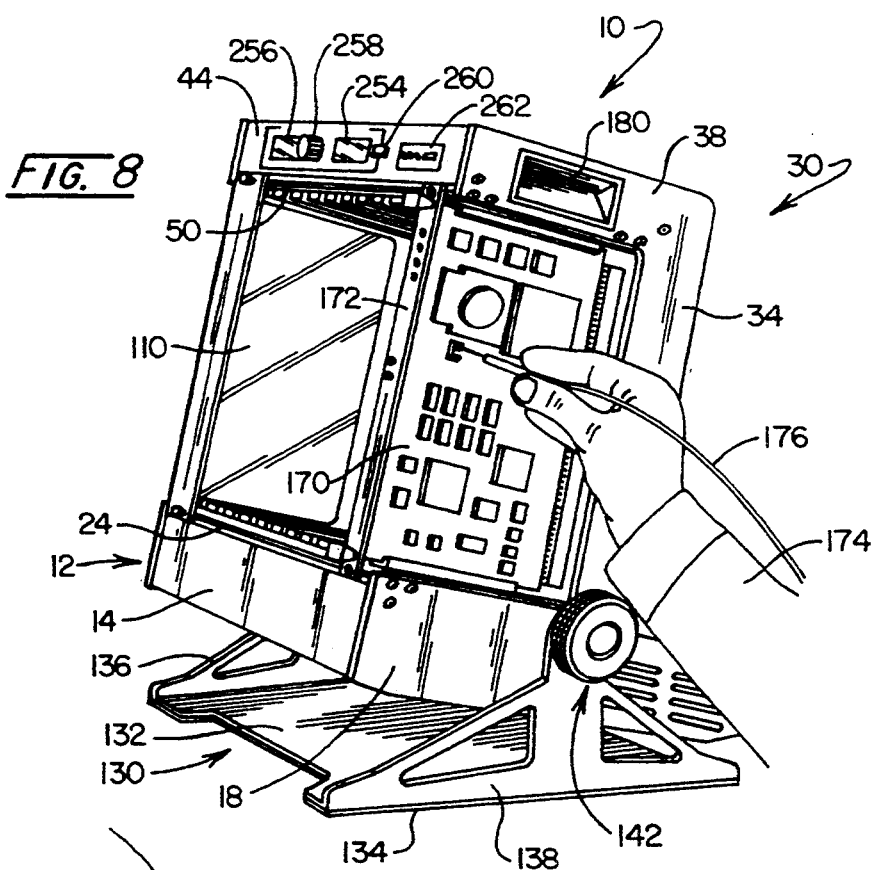
FIG. 8 is a pictorial view of the apparatus of FIG. 1 demonstrating a technologist's utilization of its tilt feature and access to a circuit module face.
Figure 9:
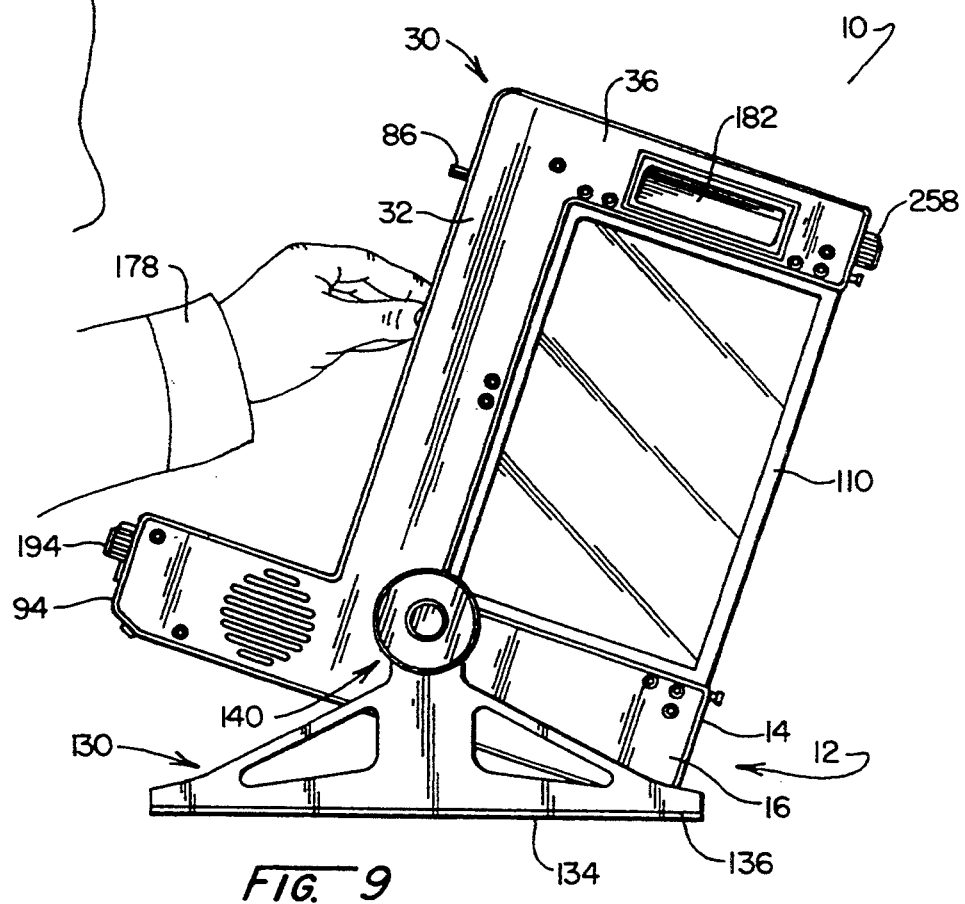
FIG. 9 is a pictorial representation of the apparatus of FIG. 1 demonstrating a technologis's access to the rear portion thereof for a forward tilt orientation.

FIGS. 8 and 9 reveal two salient aspects of the apparatus 10 in the course of its use by electronics design and test 7personnel. FIG. 8 shows an orientation of the apparatus 10 wherein it is pivoted so as to elevate and angularly orient the card retaining forward portion thereof. The figure shows a circuit module or card 170 having a forward DIN panel 172 attached to cross supports 50 and 24. Note that the side panel 118 has been removed such that the technologist has unrestricted access to every part of the module 170. In this regard, an exemplary arm and hand 174 is depicted applying a circuit probe 176 to the exposed component retaining base of the module 170.

The apparatus 10 also affords substantial advantage to the technologist in the course of interconnecting a sequence of modules, for example, through the undefined J2 section of a VME backplane. Where conventional racks or cages are utilized for the purpose of preliminary testing and assembly, the wire wrapping procedure of interconnection at the rearward face of the backplane as described in conjunction with FIG. 4 at array 76 is quite arduous and ergometrically unsatisfactory. The number of pin connections may mount to several hundred in a typical assembly experience. Where the technologist must "reach around" other components of the enclosure such as power supplies and the like, the identification of the small connecting pins of the backplane at the connector array 76 can become quite difficult. FIG. 9 shows the base of the apparatus tilted downwardly in a forward direction to, in turn, improve the access of the rearward face of backplane 60 to the operator. In this regard, the arm and hand 178 of a technologist is seen accessing the backplane 60 with the backpanel cover or shroud 80 (FIG. 3) removed. With the arrangement shown, the entire rearward face 70 of the backplane 60 is completely accessible for wire wrapping and the like. To further facilitate the moving of the apparatus 10, recessed hand grips shown at 180 in FIG. 8 and 182 in FIG. 9 are located within top assembly 30 at respective sides 36 and 38.

Now looking to the controlled air flow provided with the apparatus 10, reference is again made to FIG. 3. That figure reveals the forward positioning of one fan 190 of two adjacently-disposed D.C. motor driven fans 190 and 192 which are located in the forward portion of base 12 beneath the array 22 of lower module support components the second of these fans is shown at 192 in phantom in FIG. 2. Fans 190 and 192 are selected such that each, for example, has a maximum output of 82.5 CFM at 12 VDC. The speed of these fans may be regulated between values of full speed and 50 percent of that full speed. This permits the technologist to adjust the speed of the fans for deriving air flow requirements. Such alteration is made by manual adjustment of a switch actuating knob 194 mounted upon the rearward surface 94 of base 12. In one embodiment, the fans may operate in conjunction with a thermistor or NTC resistor where the fan speed is automatically determined to assure proper air flow, during burn-in periods. Additionally, fan speed may be reduced where possible on an automatic setting during intervals of use by programmers and the like. In the latter regard, excessive fan speeds will generate undesirable noise levels which can be distracting to personnel. Notwithstanding that automatic embodiment, the fan speeds can be adjusted manually from the noted 50 percent level to 100 percent of available speed at knob 194. Fans 190 and 192 may be provided, for example, as a Variofan 4312 MV device marketed by Papst-Motoren GmbH & Co. of St. Georgen/Black Forest Germany. Looking to the air path generated by the fans 190 and 192, FIG. 3 shows an intake port and filter assembly 196 positioned beneath fan 190. The filter component of assembly 196 includes a somewhat resilient plastic frame 198 which fits within a recess formed within bottom surface 92 of base 12. Fan 190 is retained in position by a bolted connection as shown. FIG. 7 provides another view of the positioning of fans 190 and 192. In this regard, the intake port and filter assembly 196 again is revealed in connection with frame 198, while a corresponding and identically structured intake port and filter assembly 200 incorporating a resilient plastic filter frame 202 is shown in adjacent relationship. As is apparent, filters for the apparatus 10 are readily changed to assure proper air flow. Adjacent to fans 190 and 192 is a power supply seen in FIGS. 3 and 7 at 204. Power supply 204 is seen to extend slightly beneath the backplane 60 as well as somewhat rearwardly thereof within the base 12. Note, in particular, its position is selected as being non-interfering with the rearward face 70 of backplane 60 to assure manual access to that actively utilized region.

The air path developed by fans 190 and 192 is seen to commence at the intake port at assembly 196 as represented by path arrows 206. From the fans 190 and 192, air is directed upwardly in a positive pressure driven fashion as represented by path arrows 208 to pass through the interstices or openings between the lower module support components 22. The air path then moves across cards or modules within card or module retaining region 210 as represented by the arrows 212. For thermal and air flow analysis, the forward face of the apparatus 10 can be closed off by the attachment of filler panels of, for example, 0.8 inch widthwise dimension between the cross supports 24 and 50 utilizing hand-actuated machine screws similar to those utilized, for example, at 114 and 115. Such an enclosure of the region 210 is represented by the phantom panels shown in FIG. 3 at 214. As the fan forced air passes over the modules within region 210, it impinges upon and passes through the openings or interstices between parallel, spaced-apart upper module support components represented generally at 54. Then, as represented by arrows 216, the air passes through the top assembly 40, exiting through a grate structure 218 formed within top panel 46 as represented at arrows 220. The positive pressure generated by fans 190 and 192 advantageously provides a substantially uniform air flow upwardly through the internal region 210.

It is important that a heat removal arrangement be provided for the power supply 204 during the variable operational conditions contemplated for apparatus 20. In this regard, the power supply will be called upon to generate power and thus dissipate heat occasioned by, for example, its level of efficiency. In addition to the heat generated by the supply itself, it also may direct current to dummy load resistors during start-up procedures or the like which, in turn, will generate thermal energy. Such resistors are located rearwardly of the power supply 204 as at 222 and 224 (See additionally FIG. 4.). To accommodate for heat removal at power supply 204 over variations of power demand, deflector 102 seen in FIG. 3 is configured for deflecting about 20 percent of the quantity of air expelling from fans 190 and 192 to move along a pathway represented by arrows 226 and to pass over the top of supply 204 as well as dummy resistors 222 and 224 and exit rearwardly from the base 12 as represented at arrows 228. This exit is facilitated by a grate structure 230 which is more clearly seen in FIGS. 4 and 7. Looking to the latter figures, a complementary or enhancing supply of heat removal air is provided by a fan assembly 232. Fan 232 additionally assures the flow of air over potential hot spots or the like on the power supply 204 and may have an output, for example, of 25 CFM. The air flow path for fan assembly 232 calls for an input of air through a grid (not shown) within base 12 side 18 as represented by arrows 234 shown in FIGS. 4 and 7. The air path then travels through the open frame power supply 204 as represented by arrows 236 in FIG. 7, thence through the fan assembly 232 and outwardly from a grid as seen at 238 in FIG. 1 and represented by arrows 240 as seen in FIGS. 4 and 7. With the arrangement shown, air flow is through the open frame power supply 204 as opposed to being across it such that the negative form of air draw is complementary to the positive air flow passing over the top of the supply 204 in consequence of deflector plate 102. The small fan assembly 232 is not controlled from the knob 194 but provides a constant air flow when the apparatus 10 is in use, thus assuring the presence of cooling air notwithstanding the operational status of fans 190 and 192.

The power supply 204 is operationally configured to provide a sequence of voltage characterized outputs which, for the exemplary VME embodiment at hand will include +5 v, +12 v, and −12 v. Of those outputs, the −12 output is employed, inter alia, in powering the fans within the apparatus 10. To assure stable operation of the power supply 204 on those occasions where it is energized without the presence of load defining circuit modules in the apparatus, a dummy load is provided with respect to +12 v and +5 v outputs as represented by the earlier described resistors 222 and 224 (FIG. 4) which are coupled between the appropriate power supply output and ground. FIG. 4 also reveals the presence of a receptacle 250 for supplying an outside source of a.c. power to the apparatus 10 as well as an on and off switch 252.

To aid the technologist in developing and testing circuit modules, apparatus 10 features a power utilization monitoring arrangement. In this regard, the electrical parameters of voltage and amperes are accurately monitored. This monitoring feature looks not to the status of those parameters at the power supply 204 itself, but as those parameters as they are present at the backplane 60. Because both the parameters of voltage and amperes or current are monitored, the technologist may determine with considerably enhanced precision the requisite power requirements for an assemblage of circuit modules. Thus, the power supply required for those modules of a system under test generally will not be over-specified, a situation leading to undesirably enhanced bulk and cost. Looking to FIGS. 1 and 2, top front panel 44 is seen to support two power supply parameter readouts, a digital meter reading voltage at 254, and a digital meter providing a current readout at 256. Intermediate the digital meters 254 and. 256 is a selector switch 258 providing for operator selection of the noted −12 v, +12 v, +5 v, and a high current condition at +5 v. Also located at the panel 44 is a temperature function switch 260, the actuation of which alters the mode of voltage meter 254 to one measuring position responsive air temperature and adjacent thereto is a module 262 providing a power-on reset and debounced manual reset switch with a 200 ms timing pulse. Within the module 262 a red LED is positioned to show the duration of that timing pulse. Another red LED is energized in the event of a SYSFAIL alert; while a green LED is energized to indicate a condition of power being on. Module 262 is marketed, for example, under the trade designation "MicroReset" by Tracewell Enclosures, Inc. of Westerville, Ohio.

The conveyance of power to backplane 60 from the power supply 204 and the monitoring of the power supply at that location is illustrated in connection with FIG. 4. Looking to that figure, a series of flexible cables emanating from the noted voltage categorized outputs are represented at 264 extending along one side of the apparatus 10 adjacent the rearward face 70 of backplane 60. Preferably, the cables of this grouping thereof at 264 are of an insulated, extra-flexible variety which are of strand construction and utilize a non-medical grade silicon rubber insulation. Such cable is marketed, for example, by Cooner Wire Company of Chatsworth, Calif. Two cables of this grouping at 264 as shown at 266 and 268 carry +12 v and −12 v categorized supply to connections at 270 and 272 at backplane rearward face 70. A pair of these cables as represented at 272 carries +5 v categorized supply, two cables being utilized in view of the higher currents experienced for that power supply output. Finally, an instrument ground is provided by a cable 274. The +5 v power supply input to the backplane 60 requires a sequence of, for example, nine inputs. To avoid the clutter occasioned by separate wiring to each such input, a common bus bar 276 is provided. In similar fashion, the ground input from cable 274 is provided by a multiple connective bus bar 278 located below bus bar 276. These bus bars 276 and 278 preferably are covered with a plastic cover following their installation and wiring for safety purposes.

The monitoring of current at backplane 60 is carried out through the utilization of three closed loop Hall effect current sensors mounted closely adjacent the power inputs to the backplane. In this regard, +12 v output cable 268 extends through Hall effect sensor 278; −12 v cable 266 extends through Hall sensor 279, and paired +5 v cables 272 extend through Hall sensor 280. Sensors 278–280 function to measure current at backplane 60 with complete electrical isolation between the current carrying cables associated therewith and the sensor output. The devices are marketed, for example, as Model CL-50 by F. W. Bell, Inc., of Orland, Fla. Sensors 278–280 are retained in adjacency with the backplane 60 upon a vertically disposed elongate circuit board 282. Board 282 additionally includes a nulling switch 284 as well as adjustable potentiometer groupings as at 286.

Voltage at the backplane 80 is monitored from a harness or grouping of cables represented generally at 288 disposed at the opposite side of backplane 80 and having appropriate leads tied with connector positions 270 and 272 as well as to the bus bars 276 and 278. Thus, both electrical parameters from which power may be determined are monitored in a manner deriving their values at the backplane itself as opposed to at the power supply 204.

Figure 10:
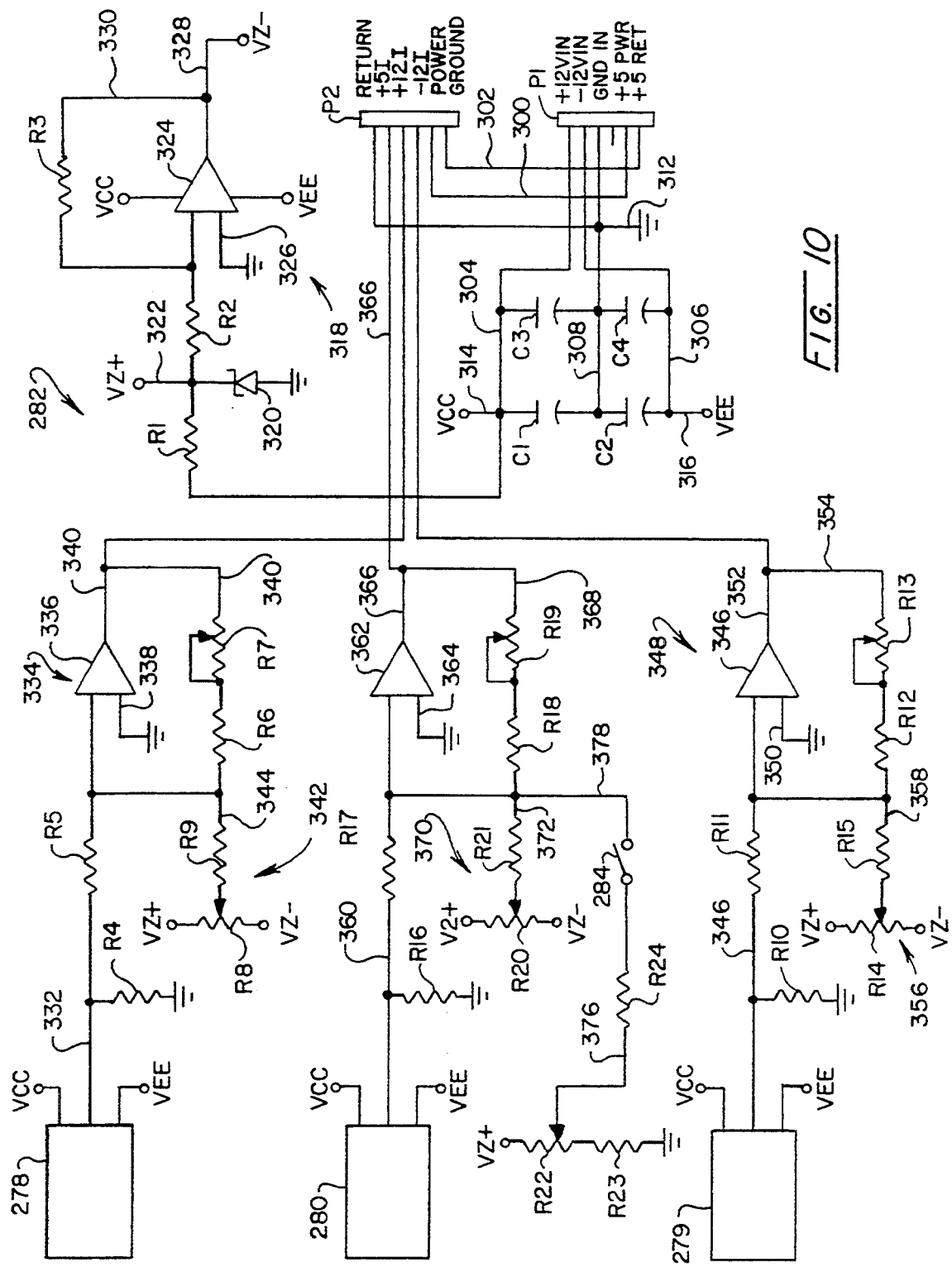
FIG. 10 is an electrical schematic diagram of the current monitoring circuit employed with the apparatus of FIG. 1.

Referring to FIG. 10, an electrical schematic diagram is provided which corresponds with the components mounted on the circuit board 282. Accordingly, that numeration reappears generally identifying these components in the figure. This circuit receives its power from the power supply at a connector labeled "P1" and is shown receiving both a +12 and −12 v input as well as power supply ground. The +12 v and −12 v inputs from the power supply as introduced through connector P1 are respectively directed via lines 304 and 306, while the power supply ground input is directed via line 308 to a filtering network represented generally at 310 comprised of capacitors C1–C4. In addition to providing a developed ground as represented at line 312, the power inputs for current monitors 278–280 are derived as labeled VCC at line 314 and VEE at line 316. These labels appear in conjunction with input lines to the noted monitors 278–280.

To support the monitoring function, a reference network 318 is provided which is responsive to incoming +12 v at line 304 where it is stabilized through the utilization of an integrated circuit represented by Zener diode symbol 320 coupled between line 304 and ground which is sometimes referred to as "an active Zener diode". Device 320 may be provided, for example, as a type IN5226B. Note in this regard that the input to the device emanates from line 304 through resistor R1 and the stabilized reference voltage labeled "VZ+" is provided at line 322. Network 318 also is called upon to provide a negative reference voltage; accordingly, line 304 additionally is directed via resistor R2 to the inverting input of an operational amplifier 324. The opposite input to amplifier 324 is coupled to ground via line 326 and the output thereof developing a negative reference labeled "VZ−" is provided at line 328. A feedback line is coupled between lines 328 and 304 as represented at line 330 and resistor R3. Resistor R3 has an identical resistance value as resistor R2. Shown powered from earlier-noted VCC and VEE sources, the device 324 may be provided, for example, as a type LT1079C.

Hall effect device 278 is a +12 v current monitor having power inputs, as labeled, coupled with VCC and VEE and an output at line 332 carrying a current which is proportional to the current drawn through earlier described cable 268 in the close vicinity of backplate 260. Current at output line 332 is submitted to signal treatment as are the outputs of all monitors 278–280. The output at line 332 is stabilized by a resistor R4 coupled from it to ground and is directed to a summing amplifier and gain converter network represented generally at 334. Network 334 includes an operational amplifier 336 which may be provided, for example, as a type LT1079C. Inverting input to the amplifier is coupled with line 332 through input resistor R5, while its non-inverting input is coupled to ground via line 338. The output of device 336 is present at line 340 and the gain thereof is developed by feedback line 340 incorporating resistor R6 and gain trim potentiometer R7. Because the Hall effect devices as at 278 will exhibit an offset current of either positive or negative polarity, an adjustable offset network 342 is provided comprised of potentiometer R8 and resistor R9 which are coupled to input line 332 via line 344. The resultant gain and offset adjusted output at line 340 from network 334 is directed to connector P2 as labeled "+12I".

In similar fashion, the output of Hall effect device 279, monitoring −12 v designated current is provided at line 346 as stabilized via resistor R10 extending to ground. Output line 346 is directed through resistor R11 to the inverting input of an operational amplifier 346 within a summing amplification and gain converter network 348. Amplifier 346 is identical to that at 336. As before, the non-inverting input to device 346 is coupled to ground via line 350 and the output thereof at line 352 is coupled to feedback line 354 incorporating gain defining resistor R12 as well as gain trim potentiometer R13. Also coupled to this feedback path via line 358 is an offset network 356 comprised of potentiometer R14 and resistor R15. As before, network 356 functions to null any offset currents which device 279 develops. Output line 352 is seen extending to connector P2 for providing the signal labeled "−12I".

Hall effect device 280, monitoring the relatively higher current which may be extant at the +5 v input to backplane 60 is similarly structured, having an output at line 360. A stabilization resistor R16 is coupled between line 360 to ground and line 260, incorporating a gain defining resistor R17 to the inverting input of operational amplifier 362. Device 362 is identical to that at 336 and the non-inverting input thereto is coupled to ground via line 364, while the output thereof is present at line 366. The gain of amplifier 362 is set by resistor R17 and a feedback path including line 368, resistor R18, and gain trimming potentiometer R19. As before, the normally encountered offset of Hall effect device 280 is subtracted by an offset network 370 formed of potentiometer R20 and resistor R21 coupled via line 372 to line 368. Line 366 is seen directed to connector P2 to provide a signal labeled "+5I".

As discussed earlier herein, the +5 v associated components of backplane 60 represent circuits which incorporate terminating resistor networks for the signal lines. Thus, for each important signal line of the backplane system, there is a resistor coupled to ground. Consequently, with no circuit modules attached to the backplane, the terminating resistor networks embedded within it will draw a current from the +5 v designated supply. In this regard, a readout at the current meter 256 will show a current of about 1.25 amperes in the absence of an inserted circuit module or card. Thus, the technologist generally will record that inherent current value and subtract it from readings made after the circuit module or card is plugged into the system. Apparatus 10, through operator actuation of switch 284, however, provides a secondary offset adjustment for this terminating resistor network occasioned static current. Thus, where switch 284 is actuated by the operator, meter 256 will read zero in the absence of an inserted card. To provide this secondary offset, a nulling network 374 is provided which is comprised of potentiometer R22, and resistor R23 connected between VZ+ and ground, line 376 coupled to the wiper of potentiometer R22, and through resistor R24 and switch 284 to line 378. Line 378, in turn, is seen coupled to line 368, thus providing a secondary offset.

The signals thus compiled at a connector labelled "P2" are coupled to a circuit board located within top portion 40 and associated with the meters 254 and 256. These meters may be provided, for example, as 3 ½ digit voltmeters of size suited for PC board mounting and utilizing LED-based numerical output representations. The devices may be provided, for example, as type DMS-30PC series digital panel meters marketed by Datel, Inc. of Mansfield, Mass. Looking again to connector P1, an input of +5 v for meter powering is identified as "+5vPWR" is seen to be provided as well as a +5 v return or ground labeled "+5vRET". The latter two inputs are directed as represented at respective lines 300 and 302 to connector P2 for complementary coupling with a meter supporting circuit coupling described in FIG. 11 at a connector P4. By so separately powering the meters as at 254 and 256, noise developed from their inherent operation is avoided with respect to the circuit of FIG. 10.

Figure 11:
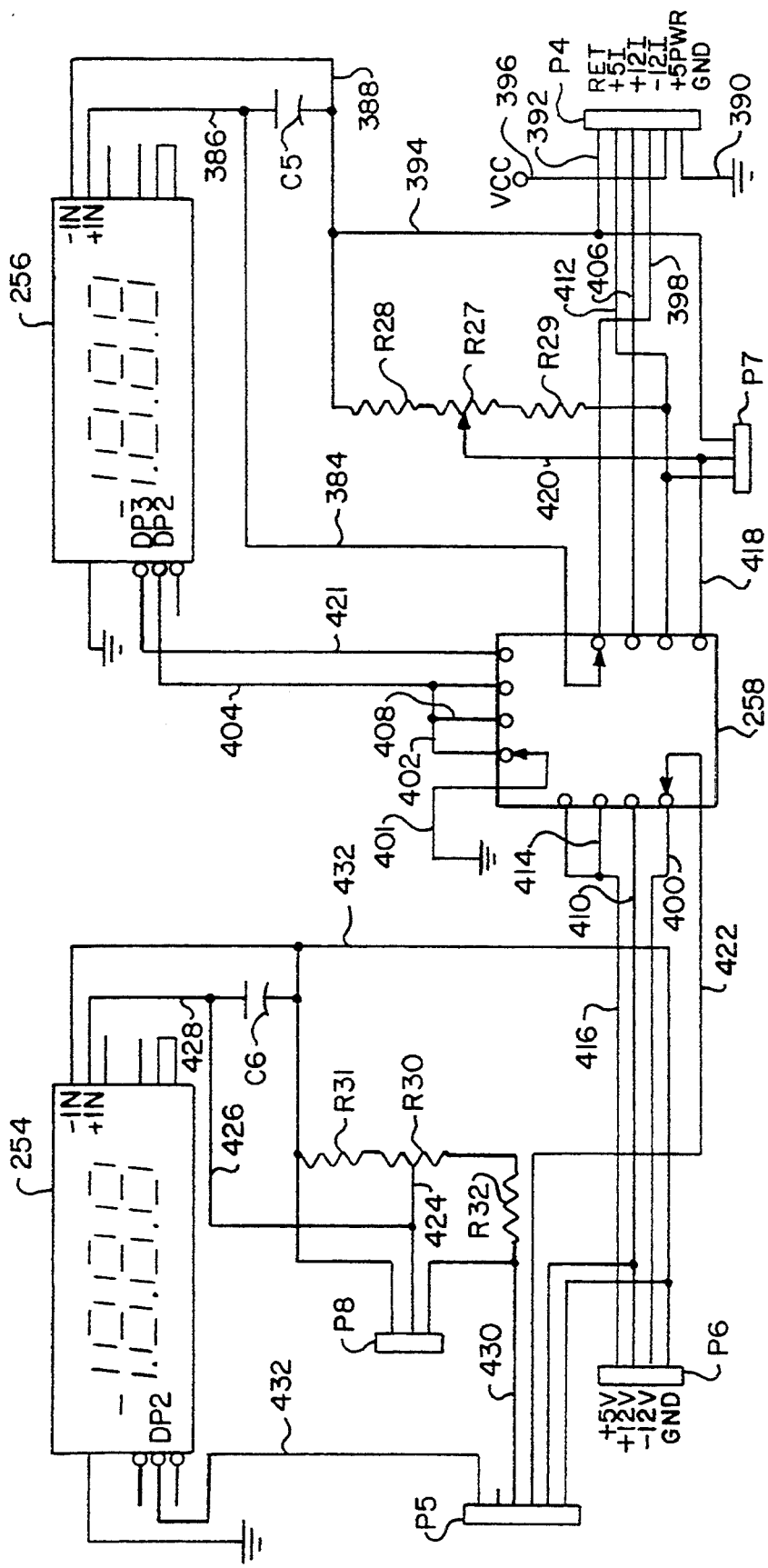
FIG. 11 is an electrical schematic diagram showing the configuration of meters and associated switching employed with the apparatus of FIG. 1.

Looking to FIG. 11, meters 254 and 256 again are represented in conjunction with a diagrammatic representation of selector switch 258. Monitored current signals as described in FIG. 10 as being made available from connector P2 are applied to the instant meter circuit via a corresponding connector labeled "P4". It may be observed that the same voltage categorized signal inputs are labeled in conjunction with connector P4 as are seen at connector P2. In this regard, a separate ground is shown in conjunction with line 390, while a noise avoiding return is seen at lines 392 and 394, the latter line being coupled with line 388, leading in turn to the −IN terminal of meter 256. The input terminal "+IN" of meter 256 is coupled to line 386 which, in turn, is connected to a switching line 384 of switch 258. The "+5 v PWR" input for powering components is shown in connection with line 396 labeled "YCC", while the assertion of −12I designated current to meter 256 commences at line 398 which is directed to switch 258. Switch 258, for the selection of −12 v categorized inputs functions to couple line 398 with line 384, line 422 with line 400, and decimal point selection lines 402 and 404 with ground line 401. Correspondingly, where the technologist elects a readout for +12 v categorized readings, switch 258 is turned to a configuration coupling lines 384 and 406, lines 401,408, and 404 and line 422 with line 410.

Two positions are selectable at switch 258 for the +5 v categorized reading for current. This is required inasmuch as the level of current for this designated input can be quite high, reaching, for example, to 70 amperes. Where the current, for example, which is read at meter 256, is below 20 amperes, then meter 256 will properly respond to a switch 258 configuration coupling line 384 with at line 412 and grounding the decimal point selecting line 404 with line 401. Further voltage selecting line 422 is seen coupled with lines 414 and 416. Correspondingly, where a higher current is indicated, for example by a blinking of the display at meter 256, the operator may actuate switch 258 to a high current 5 v categorized setting. This will couple line 412 with an attenuation resistor string including potentiometer R27 and resistors R28 and R29. The switching path then continues to line 384 from lines 420 and 418. This attenuation of the signal within the circuit path to meter 256 occurs in conjunction with a switching of the decimal point input signal through application of ground line 401 with line 421. Capacitor C5 is inserted between lines 386 and 388 for filtering purposes.

Looking to the voltage inputs to meter 254, the outputs from cable grouping 288 as described in conjunction with FIG. 4 are present at a connector labeled "P6" in FIG. 11. These inputs, as labeled +5 v, +12 v, −12 v, and GND are applied from line 422 to the +in input of voltage meter 254 following their attenuation at a 10:1 ratio by a resistor attenuation string including potentiometer R30 and resistors R31 and R32. In this regard, the wiper of potentiometer R30 at line 424 is coupled to the input labeled "+IN" of meter 254 via lines 426 and 428. Line 422 is seen to extend to a connector labeled "P5" which is associated with a temperature buffer circuit. This line is directly coupled through a temperature election switch to return the signal to switching selector line 422. Return from meter 254 as labeled -IN is provided at line 432 which leads to backplane ground (GND). As indicated earlier, where the switching line 422 selects line 400, then the voltage level at the backplane for the −12 v categorized power supply is displayed. Correspondingly, where election is made of line 410, then the +12 v categorized power supply output at the backplane is displayed and, where either of the +5 v categorizations are elected, then line 416 is selected by the switching line 422. Decimal point selection for meter 254 is normally carried out by applying terminal DP2 to ground via line 432 which extends to coupling P5. Only one setting is required for all voltage readings. However, the decimal point will be seen to be removed for purposes of using the meter 254 for providing an output reading of temperature. Two additional connectors are shown in FIG. 11, labeled "P7" and "P8". These connectors are utilized for test point purposes only.

Heat analysis of cards or circuit modules under development or test may be carded out utilizing apparatus 10 in a temperature measurement mode selected by actuation of switch 260 at the front panel 44 as seen in FIGS. 1 and 2. To provide this analysis, the card cage or internal region 210 (FIG. 3) may be closed up using DIN front panels and air restrictor covers or filler panels as described earlier which connect between cross connectors 24 and 50. To carry out temperature measurement, air directed under positive pressure from fans 190 and 192 across the circuit modules being evaluated exits as described at 216 in FIG. 3 at a given elevated temperature which is dependent upon the heat output characteristics of the cards. The temperature of this air is measured within top portion 40 by a movable wand retained thermistor. Such a thermistor is seen in FIG. 3 at 440 being supported upon a wand or rod 442, in turn extending from a slidable mount 444. Looking additionally to FIG. 4, it may be observed that mount 444 is retained within a generally horizontally disposed elongate slot 446 formed within rearward support panel 48 by a small handle 448 For the preferred embodiment of apparatus 10, thermistor 440 is selected as Series DC95F marketed by Thermometrics, Inc. of Edison, N.J. The device provides an output, which is appropriately buffered to develop a temperature output signal corresponding with the temperature of the evaluated air flow. That temperature is then displayed at voltmeter 254. For such display, the decimal point is deleted at meter 254. Of course, a separate meter can be employed for temperature readout.

Figure 12:
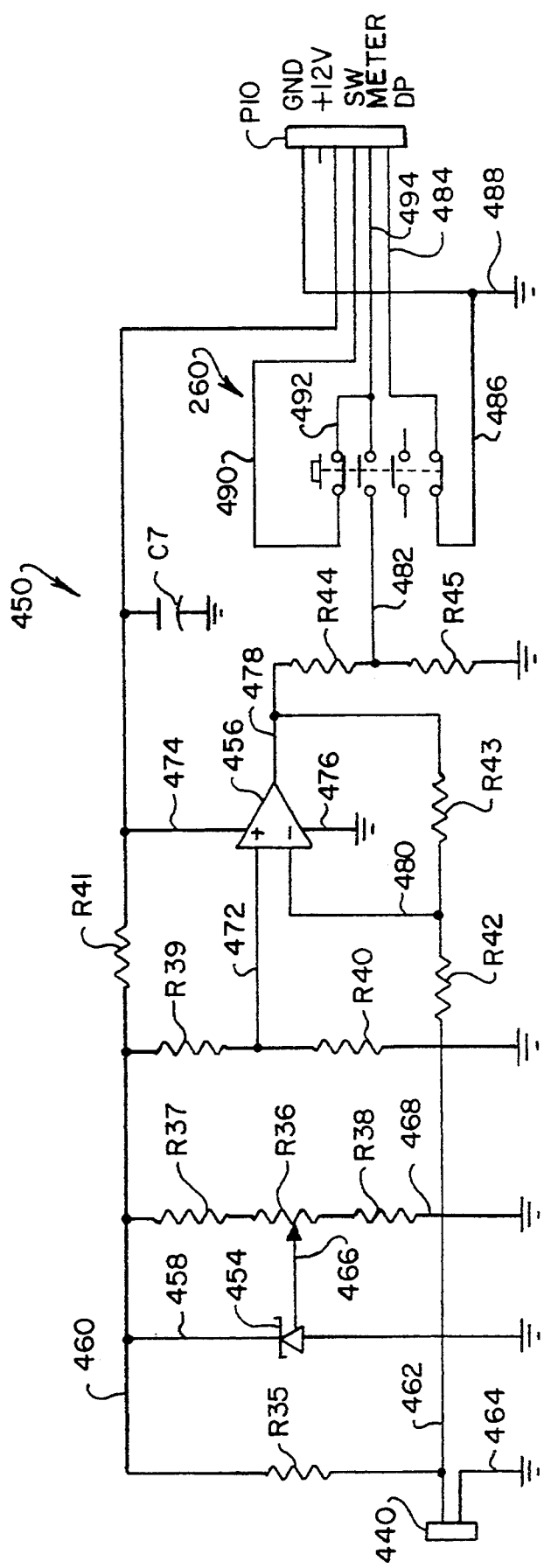
FIG. 12 is an electrical schematic diagram of a temperature sensor buffer circuit employed with the apparatus of FIG. 1.

Looking to FIG. 12, a temperature buffer circuit which may be employed in conjunction with thermistor 440 is represented generally at 450. Circuit 450 performs in conjunction with a dual component device identified as an LM611IN marketed by National Semiconductor Corp. The device includes an accurate voltage reference component represented by the Zener diode symbol 454 and an operational amplifier seen at 456. Reference component 454 is seen coupled via lines 458, 460, resistor R35, and line 462 to one input to thermistor 440. The opposite input to the latter device is to ground via line 464. The accurate output of reference 454 may be adjusted as represented by a wiper line 466 associated with a potentiometer R36 forming one part of a resistor network additionally including resistors R37 and R38 coupled within line 468 between line 460 and ground. With the arrangement shown, resistor R35 and thermistor 440, exhibiting resistor characteristics variable with temperature constitute, in effect, a voltage divider having an output at line 462. However, that output exhibits incorrect gain as well as an offset. To accommodate for this, a line 470 is provided between line 460 and ground which incorporates resistors R39 and R40. Line 472 taps line 470 intermediate the latter resistors to provide one input to amplifier 456 of precision voltage which functions to effect a subtraction of the output signal offset. Resistor R41 within line 460 provides a voltage adjustment at that line which, in turn, is coupled to +12 v supply. Capacitor C7, coupled between line 460 and ground, provides noise filtering. Amplifier 456 is coupled to line 460 via line 474 and to ground via line 476. The gain of device 456 is established by resistors R42 and R43 which are positioned within line 462 which, in turn, extends to the output of amplifier 456 at line 478. Line 480 extends from the mid-point between resistors R42 and R43 to the inverting input of amplifier 456. In general, the gain established by amplifier 456 is selected to provide for its linear operation, however, such gain is excessive for the purposes of supplying temperature signals to meter 254. To return the signals to appropriate levels, the output at line 478 is attenuated by resistors R44 and R45, and presented at line 482 to temperature selection switch 260. Switch 260 functions to turn off decimal point enablement at meter 254 as controlled from line 432 leading to connector P5 described in connection with FIG. 11. Line 432, through that connector, is coupled to switch 260 via line 484 extending from connector P10 at a location labeled "DP". Switch 260 is shown in an off mode such that line 484 is seen coupled to ground through the switch via lines 486 and 488. In this off configuration, it also may be noted that line 490 extending from connector P10 at label "SW" returns without alteration via lines 492 and 494 to connector P10 at a position labeled "METER". This connection provides for immediate return to line 422 as described earlier in connection with FIG. 11. However, where switch 260 is actuated by the technologist to provide a temperature input to meter 254, then line 482 is connected to line 494 and an open circuit exists between decimal point defining lines 484 and 486.

Figure 13:
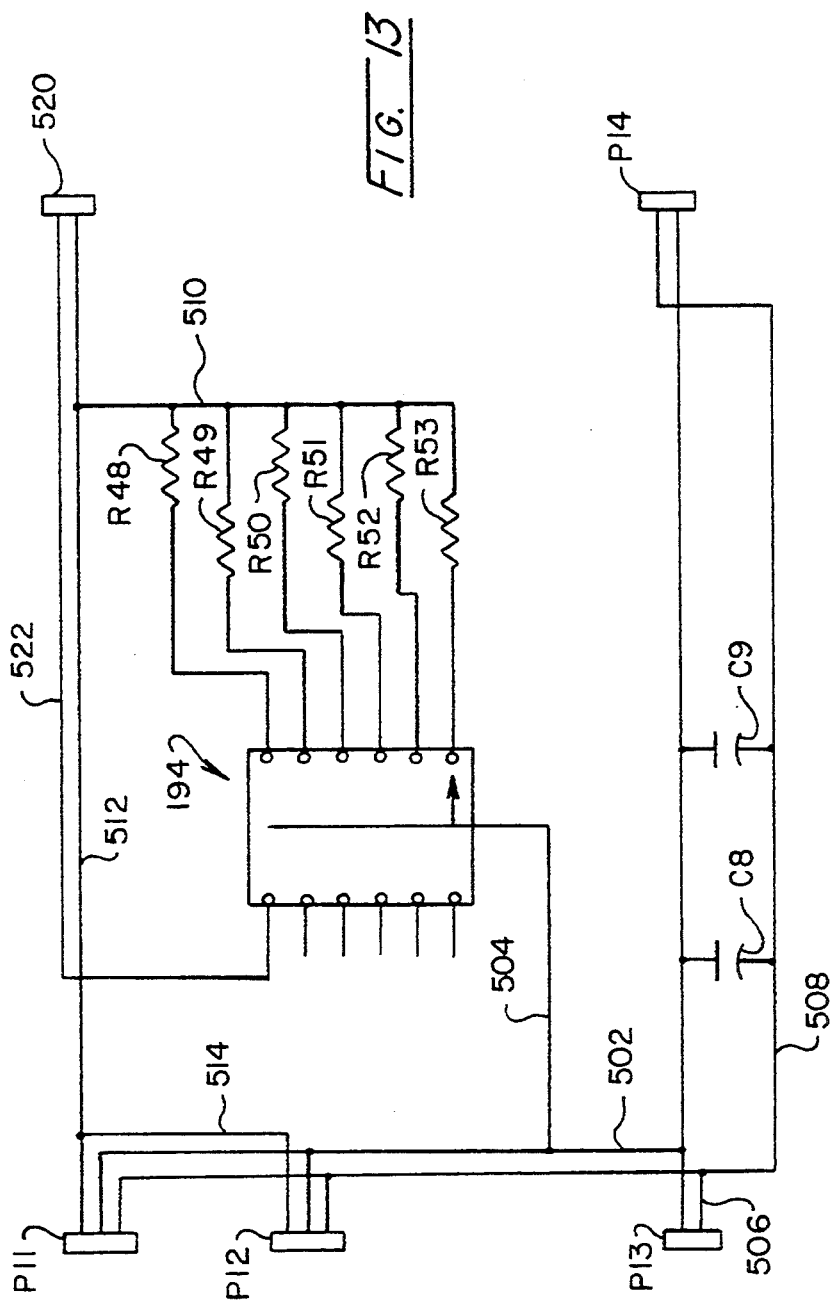
FIG. 13 is an electrical schematic diagram of a fan speed switching and powering network employable with the apparatus of the invention.

Referring to FIG. 13, the drive arrangement for fans 190, 192, and fan assembly 232 are revealed. Power is supplied to this fan control circuit from connector P 13, ground being supplied therefrom to lines 500, 502, and 504. Additionally, −12 v is applied from connector P13 to lines 506 and 508. Lines 502 and 508 are seen to extend to connectors P11 and P12 which, respectively, provide drive input to fans 190 and 192. Similarly, lines 500 and 508 supply input to a connector P14 which, in turn, is coupled to energize smaller power supply fan assembly 232. The speed of larger variable speed fans 190 and 192 is controlled by relatively simple application of a resistance to a specified one of their inputs. In this regard, a sequence of resistors R48–R53 of increasing resistance value are seen coupled to the switching terminals of switch 194 and through control line 510, 512, and 514 to a control input to the fans via connectors P11 and P12. By selecting an appropriate switch position, any one of the resistors R48–R53 may be applied to the control inputs of the fans to adjust speed. Correspondingly, the smaller, power supply fan 232 is continuously energized from lines 500 and 508. Capacitors C8 and C9 provide a filtering function.

In another embodiment of the invention, fans 190 and 192 may be operated in correspondence with the value of the temperature of air sensed by a thermistor corresponding to that described at 440. This substitute thermistor may be provided, for example, as a Series C100 "Thermochip" marketed by Thermometrics, Inc. of Edison, N.J. and is represented in FIG. 13 at block 520. For this embodiment, the thermistor 520 is shown coupled via lines 512 and 514 to the noted control input and via line 522 to an enabling terminal at switch 194. The use of such a fan speed controlling thermistor arrangement is helpful for application where a protection of the circuit modules is called for, for example, during burn-in procedures and the like.

Since certain changes may be made in the above apparatus without departing from the scope of the invention herein involved, it is intended that all matter contained in the above description or shown in the accompanying drawings shall be interpreted as illustrative and not in a limiting sense.

I claim:

1. Apparatus supportable upon a given surface for testing circuit board modules having circuit components mounted upon a generally planar surface, comprising:

a base having a base forward surface extending between oppositely disposed first and second base sides, an upward portion, and a plurality of parallel spaced apart lower module support components disposed along said upward portion;

a backplane support assembly having oppositely disposed first and second retainer sides, said support assembly extending upwardly from said base upward portion to an upwardly disposed region;

a backplane supported by said backplane support assembly having a forward face including a plurality of parallel module connectors located in alignment with said lower module support components, having a rearward face supporting a plurality of connector positions associated with said module connectors;

a top assembly supported from said backplane support assembly upwardly disposed region, spaced from and extending over said base and having a plurality of parallel, spaced apart upper module support components disposed in alignment with said lower module support components, said top assembly, said backplane support assembly, and said base defining a U-shaped module support having open sides; and a cradle assembly having a foot portion supportable upon said given surface and having a pivot assembly spaced upwardly from said foot portion pivotally connected with said base and actuable to effect variable angular orientations of said base with respect to said given surface so as to enhance manual access to said backplane.

2. The apparatus of claim 1 including a manually removable side panel positionable in adjacency with one of said first and second base sides, said backplane support assembly and said top assembly.

3. The apparatus of claim 2 in which said side panel is transparent.

4. The apparatus of claim 1 including:

a power supply having predetermined voltage categorized outputs mounted within said base generally rearwardly of and below said backplane; and conduit means for coupling said power supply voltage characterized outputs with said backplane.

5. The apparatus of claim 1 including:

a circuit board module cooling fan mounted at a location directing a quantity of environmental air from an entrance port to an exit port defining a path between said base and said top assembly; and a fan speed control manually actuable for selectively varying said quantity of air.

6. The apparatus of claim 5 including:

an air temperature sensor mounted within said air path adjacent said exit port and having a temperature output signal corresponding with the temperature of said air; and visually perceptible readout means responsive to said temperature output signal for displaying a value of temperature corresponding therewith.

7. The apparatus of claim 6 in which said air temperature sensor is manually positionable adjacent select ones of said upper module support components.

8. The apparatus of claim 1 including:
a power supply having predetermined voltage categorized outputs mounted within said base generally rearwardly of and below said backplane;
conduit means for coupling said power supply voltage characterized outputs with said backplane;
circuit board module cooling fan means mounted within said base forwardly of said power supply for directing environmental air along a path extending across said circuit board modules into said top assembly; and
first and second manually insertable and removable side panels positionable in adjacency with respective said first and second base sides, said backplane support assembly and said top assembly.

9. The apparatus of claim 8 including a power supply cooling fan mounted within said base adjacent said power supply and energizable to effect movement of environmental air through said power supply.

10. The apparatus of claim 9 including an air deflector mounted within said base and configured for interrupting a select portion of said environmental air within said path and directing said select portion of said environmental air in cooling relationship over said power supply.

11. The apparatus of claim 1 including a back panel removably connected with said backplane support assembly in spaced adjacency from said backplane rearward face.

12. The apparatus of claim 11 in which said back panel is transparent.

13. The apparatus of claim 1 including:
a circuit board module cooling fan mounted at a location directing a quantity of environmental air from an entrance port to an exit port defining a path between said base and said top assembly;
an air temperature responsive sensor mounted within said air path adjacent said exit port and having a temperature output signal corresponding with the temperature of said air; and
fan speed control means responsive to said temperature output signal for varying said quantity of air in correspondence therewith.

14. Apparatus for testing circuit board modules having circuit components openly accessible mounted upon a generally planar surface, comprising:
a base having a top portion, a forwardly disposed portion extending between oppositely disposed base sides and a rearwardy disposed portion at said base top portion;
a plurality of parallel, spaced apart lower module support components mounted upon said base forwardly disposed portion;
a backplane support assembly extending upwardly to an upwardly disposed region from said base top portion at a location between said base forwardly disposed portion and said rearwardly disposed portion;
a backplane supported by said backplane support assembly, having a forward face including a plurality of parallel module connectors located adjacent to and in alignment with said lower module support components having an openly exposed rearward face supporting a plurality of connector positions associated with said module connectors said base forwardly disposed portion, said backplane support assembly, and said backplane forward face defining a module support having at least one open side;
a power supply mounted within said base rearwardly disposed portion below said backplane and below said base top portion and having predetermined voltage categorized outputs; and
conduit means for coupling said power supply voltage characterized outputs with said backplane.

15. The apparatus of claim 14 including a top assembly supported from said backplane support assembly upwardly disposed region, spaced from and extending over said base and having a plurality of parallel, spaced apart upper module support components disposed in alignment with said lower module support components, said top assembly, said backplane support assembly and said base forwardly disposed portion defining a U-shaped said module support having open sides.

16. The apparatus of claim 15 including a manually removable side panel positionable in adjacency with one of said base sides, said backplane support assembly and said top assembly.

17. The apparatus of claim 16 in which said side panel is transparent.

18. The apparatus of claim 15 including:
a circuit board module cooling fan mounted at a location directing a quantity of air from an entrance port to an exit port defining a path between said base and said top assembly;
an air temperature sensor mounted within said air path adjacent said exit port and having a control output signal corresponding with the temperature of said air, and
a control circuit for varying the speed of said fan in correspondence with said control output signal.

19. The apparatus of claim 14 including:
a circuit board module cooling fan mounted at a location directing a quantity of environmental air from an entrance port to an exit port defining a path between said base and said top assembly; and
a fan speed control manually actuable for selectively varying said quantity of air.

20. The apparatus of claim 19 including:
an air temperature sensor mounted within said air path adjacent said exit port and having a temperature output signal corresponding with the temperature of said air; and
visually perceptible readout means responsive to said temperature output signal for displaying a value of temperature corresponding therewith.

21. The apparatus of claim 14 including:
a current monitor positioned adjacent said backplane and having a current output signal of value corresponding with the current carried by said conduit means for one select said predetermined voltage characterized output; and
a visual current readout mounted on said apparatus and responsive to said current output signal for displaying a current value corresponding therewith.

22. The apparatus of claim 21 in which:

said conduit means includes a flexible cable extending from said select predetermined voltage characterized output to said backplane rearward face;

said current monitor comprises a Hall effect current sensor positioned adjacent backplane and surmounting said flexible cable to derive a monitor output;

said apparatus including an offset network responsive to said monitor output for deleting offset current therefrom to provide a corrected monitor output; and an attenuator network responsive to said corrected monitor output to provide said current output signal.

23. The apparatus of claim 22 in which said conduit means further includes a bus bar fixed to and extending across said backplane rearward face, electrically coupled with select said rearward face connector positions and electrically connected with said flexible cable.

24. The apparatus of claim 21 wherein:

said backplane includes terminating resistors electrically associated with said select predetermined voltage characterized output effecting a backplane specific current of given value; and said current monitor means including nulling network means for deleting a signal value corresponding with said given value of backplane specific current from said current output signal value.

25. The apparatus of claim 14 or 21 including:

monitoring circuit means electrically coupled with said backplane at a location receiving one select said predetermined voltage characterized output for providing a voltage monitoring signal; and a visual voltage readout mounted on said apparatus and responsive to said voltage monitoring signal for displaying a voltage value corresponding therewith.

26. Apparatus for testing circuit board modules comprising:

a test housing having a forward portion for receiving and supporting said circuit board modules;

a backplane supported by said housing adjacent said forward portion and having a forward face including a plurality of module connectors for electrical connection with said circuit board modules and having a rearward face supporting a plurality of connector positions associated with said module connectors;

a power supply mounted within said test housing and having predetermined voltage categorized outputs;

conduit means for electrically coupling said power supply voltage characterized outputs to predetermined power input locations at said backplane;

an electrical parameter monitor responsive to a select electrical parameter and located substantially in immediate adjacency with a said predetermined power input location for derving an electrical parameter signal corresponding with said select electrical parameter as it occurs at said backplane;

a visual readout mounted on said test housing and responsive to said electrical parameter signal for displaying a numerical value corresponding therewith.

27. Apparatus for testing circuit board modules comprising:

a test housing having a forward portion for receiving and supporting said circuit board modules;

a backplane supported by said housing adjacent said forward portion and having a forward face including a plurality of module connectors for electrical connection with said circuit board modules and having a rearward face supporting a plurality of connector positions associated with said module connectors;

a power supply mounted within said test housing and having predetermined voltage categorized outputs;

conduit means for electrically coupling said power supply voltage characterized outputs to predetermined power input locations at said backplane;

a Hall effect current sensor located substantially at a said predetermined power input location for deriving a current parameter signal at said input location;

a signal treatment network responsive to said monitor output for deleting offset phenomena therefrom and deriving a said current parameter signal corresponding with the value of current flow at said backplane; and a visual readout mounted on said test housing and responsive to said current parameter signal for displaying a numerical value corresponding therewith.

28. The apparatus of claim 27 in which:

said backplane includes terminating resistors electrically associated with current monitored by said current sensor and effecting a backplane specific current of given value; and said signal treatment network includes a nulling network for deleting a signal value corresponding with said given value of backplane specific current from said current parameter signal corresponding with the value of current flow at said backplane.

29. Apparatus for testing circuit board modules comprising:

a test housing having a forward portion for receiving and supporting said circuit board modules;

a backplane supported by said housing adjacent said forward portion and having a forward face including a plurality of module connectors for electrical connection with said circuit board modules and having a rearward face supporting a plurality of connector positions associated with said module connectors;

a power supply mounted within said test housing and having predetermined voltage categorized outputs;

conduit means for electrically coupling said power supply voltage characterized outputs to predetermined power input locations at said backplane;

a voltage monitor circuit responsive to a voltage electrical parameter located substantially at a said predetermined power input location and including an attenuator network for deriving a voltage parameter signal corresponding with the value of voltage at said backplane;

a visual readout mounted on said test housing and responsive to said voltage parameter signal for displaying a numerical value corresponding therewith.

* * * * *